US010234766B2

United States Patent
Ota

(10) Patent No.: US 10,234,766 B2
(45) Date of Patent: Mar. 19, 2019

(54) MASK PROTECTION DEVICE, EXPOSURE APPARATUS, AND METHOD FOR MANUFACTURING DEVICE

(71) Applicant: NIKON CORPORATION, Tokyo (JP)

(72) Inventor: Kazuya Ota, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/626,475

(22) Filed: Jun. 19, 2017

(65) Prior Publication Data

US 2017/0285484 A1 Oct. 5, 2017

Related U.S. Application Data

(63) Continuation of application No. 14/405,042, filed as application No. PCT/JP2012/065412 on Jun. 15, 2012, now Pat. No. 9,715,175.

(51) Int. Cl.
*G03F 7/20* (2006.01)
*G03F 1/66* (2012.01)
*G02B 27/00* (2006.01)
*H01L 21/677* (2006.01)

(52) U.S. Cl.
CPC ..... *G03F 7/70058* (2013.01); *G02B 27/0006* (2013.01); *G03F 1/66* (2013.01); *G03F 7/7075* (2013.01); *G03F 7/70741* (2013.01); *G03F 7/70916* (2013.01); *H01L 21/6773* (2013.01)

(58) Field of Classification Search
CPC ... G02B 27/0006; G03F 1/66; G03F 7/70058; G03F 7/70741; G03F 7/7075; G03F 7/70916; H01L 21/6773

USPC .............. 206/710; 355/30, 67, 75; 414/935; 430/5

See application file for complete search history.

(56) References Cited

U.S. PATENT DOCUMENTS

| 6,084,938 A | 7/2000 | Hara et al. |
| 7,514,186 B2 | 4/2009 | Meijer et al. |
| 2002/0066692 A1* | 6/2002 | Smith ................. G03F 1/66 206/710 |

(Continued)

FOREIGN PATENT DOCUMENTS

| JP | H04142023 A | 5/1992 |
| JP | H09306834 A | 11/1997 |

(Continued)

OTHER PUBLICATIONS

Aug. 28, 2012 Search Report issued in International Application No. PCT/JP2012/065412.

(Continued)

*Primary Examiner* — Colin Kreutzer
(74) *Attorney, Agent, or Firm* — Oliff PLC

(57) ABSTRACT

A reticle protection device capable of keeping a reticle therein is provided with an inner pod capable of keeping the reticle therein; an outer pod capable of keeping the inner pod therein; an electroconductive movable contact portion provided on at least one of the inner pod and the outer pod and being capable of coining into contact with an electroconductive film of the reticle; and a leaf spring for achieving electric conduction of the contact portion to at least one of the inner pod and the outer pod. The reticle is kept in the inner pod and the inner pod is kept in the outer pod, thereby enabling stable grounding of the reticle.

16 Claims, 10 Drawing Sheets

(56) References Cited

U.S. PATENT DOCUMENTS

| | | |
|---|---|---|
| 2006/0087638 A1 | 4/2006 | Hirayanagi |
| 2006/0260978 A1* | 11/2006 | Gregerson ................ G03F 1/66 206/710 |
| 2006/0292457 A1* | 12/2006 | Meijer ................... B82Y 10/00 430/5 |
| 2009/0038985 A1 | 2/2009 | Wang |
| 2012/0292509 A1* | 11/2012 | Wang ................... H01J 37/026 250/310 |

FOREIGN PATENT DOCUMENTS

| | | |
|---|---|---|
| JP | 2000-114149 A | 4/2000 |
| JP | 2002-287332 A | 10/2002 |
| JP | 2006-128188 A | 5/2006 |
| JP | 2006-184442 A | 7/2006 |
| JP | 2010-199244 A | 9/2010 |

OTHER PUBLICATIONS

Mar. 3, 2015 Office Action issued in Japanese Patent Application No. 2011-129845.
Apr. 7, 2016 Office Action Issued in U.S. Appl. No. 14/405,042.
Aug. 31, 2016 Office Action Issued in U.S. Appl. No. 14/405,042.
Mar. 20, 2017 Notice of Allowance Issued in U.S. Appl. No. 14/405,042.

\* cited by examiner

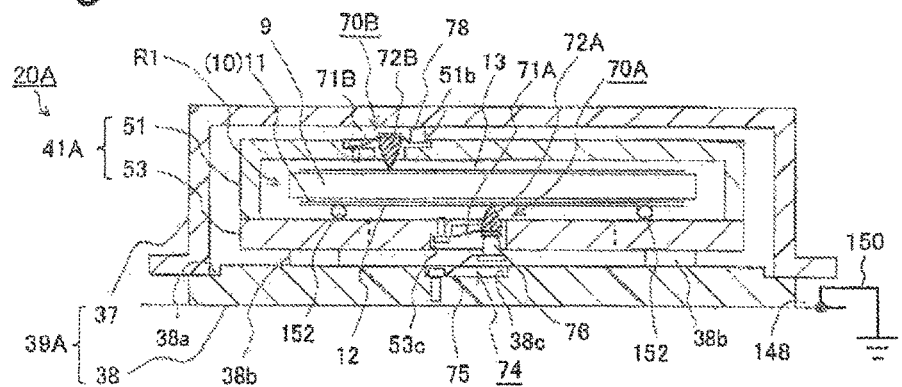
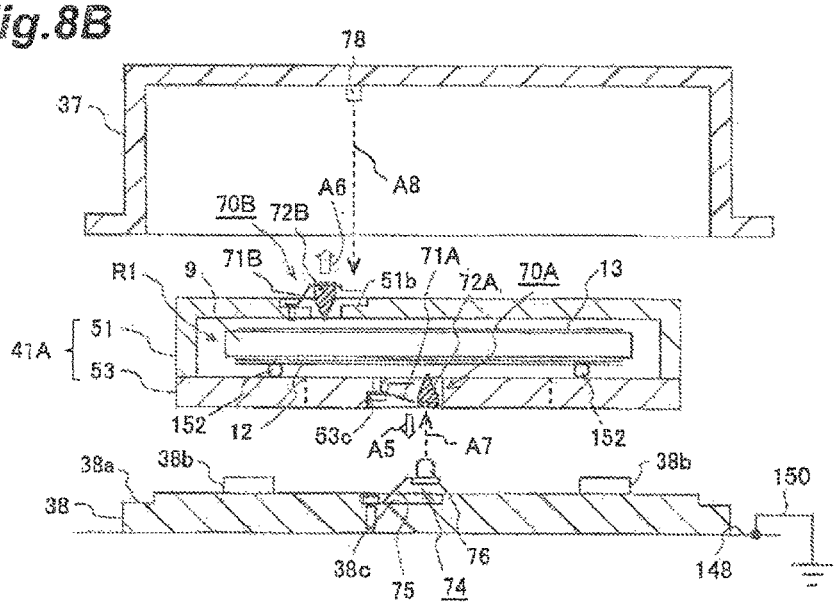

MASK PROTECTION DEVICE, EXPOSURE APPARATUS, AND METHOD FOR MANUFACTURING DEVICE

This is a Continuation of application Ser. No. 14/405,042 filed Dec. 2, 2014 (now U.S. Pat. No. 9,715,175), which is a National Stage of Application No. PCT/JP2012/065412 filed Jun. 15, 2012. The prior applications, including the specifications, drawings and abstracts are incorporated herein by reference in their entirety.

TECHNICAL FIELD

The present invention relates to a mask protection device for protecting a mask for exposure, an exposure apparatus with the mask protection device, and a method for manufacturing a device with use of the exposure apparatus.

BACKGROUND ART

In the exposure apparatus using extreme ultraviolet light of the wavelength of not more than about 100 nm (which will be referred to hereinafter as EUV (Extreme Ultraviolet) light) as exposure light, its optical system is basically composed of reflective members and a reticle with a master pattern formed thereon is also a reflective type. Since the exposure apparatus using the EUV light is installed under a vacuum environment, an electrostatic chuck is used for holding each of the reticle and a semiconductor wafer onto which the pattern on the reticle is to be transferred (which will be referred to hereinafter simply as wafer). For gripping the reticle in vacuum by the electrostatic chuck, an electroconductive film is usually formed on the back surface of the reticle.

For preventing foreign matter from adhering to the reticle and for safely carrying the reticle between the atmospheric environment and the vacuum environment, the reticle is carried while kept in a protection device called a reticle pod. If the reticle becomes charged during the carrying operation of the reticle, it could cause electrostatic destruction of the pattern and electrostatic adhesion of foreign matter to the pattern surface of the reticle. For preventing these, there is the reticle pod proposed as one provided with an electroconductive portion with a flat surface at a position opposite to the back surface of the reticle so that the electroconductive film on the back surface of the reticle and, in turn, a substrate of the reticle can be grounded through the electroconductive portion during the carrying operation of the reticle (e.g., cf. Patent Literature 1).

CITATION LIST

Patent Literature

Patent Literature 1: U.S. Pat. Application Publication No. 2006/0087638

SUMMARY OF INVENTION

Technical Problem

Since contact between the flat surfaces is utilized in the conventional way of grounding the electroconductive film on the back surface of the reticle through the electroconductive portion with the flat surface provided in a part of the reticle pod, it can be difficult to achieve stable grounding of the electroconductive film on the back surface of the reticle because of vibration or the like.

Furthermore, since the pattern surface (front surface) is a surface that is most expected to avoid the adhesion of foreign matter on the reticle, it is preferable to also enable the pattern surface of the reticle to be directly and stably grounded during the carrying operation of the reticle.

Aspects of the present invention, in light of the above-described circumstances, have an object to enable stable grounding of the mask for exposure.

Solution to Problem

A first aspect of the present invention provides a mask protection device capable of keeping a mask therein. This mask protection device comprises: a first housing container capable of keeping the mask therein; a second housing container capable of keeping the first housing container therein; an electroconductive movable member provided on at least one of the first housing container and the second housing container and being capable of coining into contact with an electroconductive film of the mask; and a first electric conduction member for achieving electric conduction of the movable member to at least one of the first housing container and the second housing container.

Furthermore, a second aspect provides a first exposure apparatus for illuminating a pattern with an exposure beam to expose an object with the exposure beam via the pattern and via a projection optical system. This first exposure apparatus comprises: the mask protection device of the present invention; and a mask stage capable of gripping to hold the mask taken out of the mask protection device.

Furthermore, a third aspect provides a second exposure apparatus for illuminating a pattern with an exposure beam to expose an object with the exposure beam via the pattern and via a projection optical system. This second exposure apparatus comprises: a mask stage capable of gripping to hold a mask; an electroconductive movable member capable of coining into contact with an electroconductive film of the mask; and an electric conduction member which grounds the movable member.

Furthermore, a fourth aspect provides a method for manufacturing a device, comprising: forming a pattern on an object with use of the exposure apparatus of the present invention; and processing the object on which the pattern has been formed.

BRIEF DESCRIPTION OF DRAWINGS

FIG. 8A is a cross-sectional view showing a reticle pod in the second embodiment and FIG. 8B a cross-sectional view showing a state in which the outer pod is detached from the inner pod.

DESCRIPTION OF EMBODIMENTS

First Embodiment

The first embodiment will be described below with reference to FIG. 1 to FIG. 7.

Figure 1:
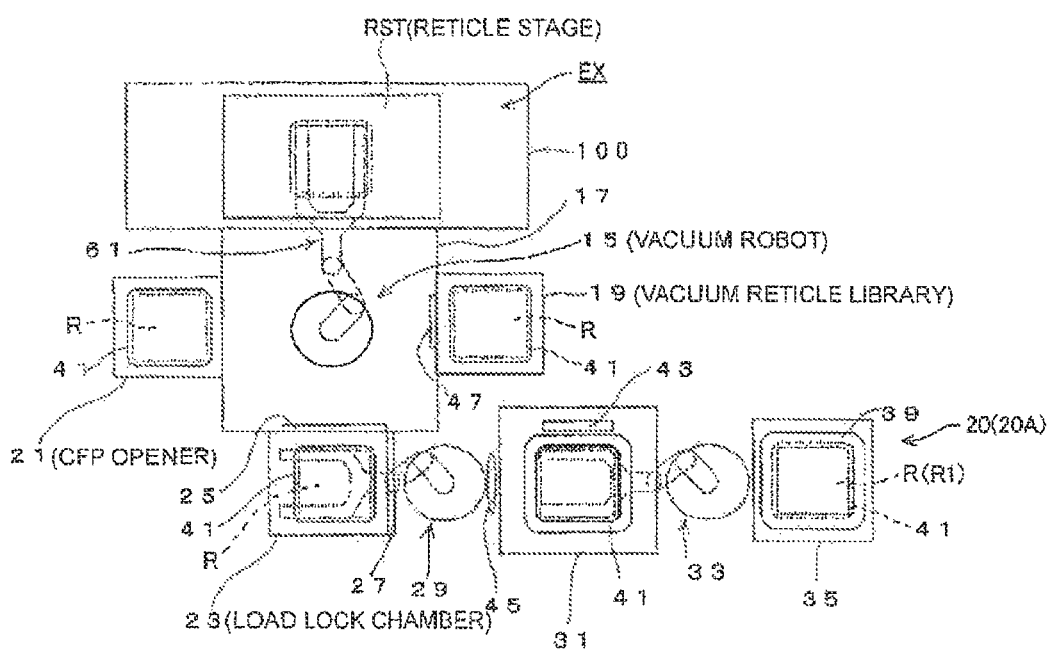
FIG. 1 is a plan view showing an exposure apparatus and a reticle carrying system in the first embodiment.

FIG. 1 shows a part of an exposure apparatus EX of the present embodiment, and a reticle carrying system for carrying a reticle to the exposure apparatus EX. The exposure apparatus EX is an EUV exposure apparatus using EUV (Extreme Ultraviolet) light of the wavelength of not more than about 100 nm as exposure light. The exposure light to be used herein is, as an example, soft X-rays of the wavelength in the range of 5 to 20 nm, e.g., the wavelength of 6.7 nm or 13.5 nm or the like.

In FIG. 1, the reticle carrying system is arranged next to an exposure chamber 100 in which the exposure apparatus EX is kept. The reticle carrying system is provided with a robot chamber 17 which is arranged next to the exposure chamber 100 and in which a vacuum robot 15 is kept, a vacuum reticle library 19 which is arranged on a first side face of the robot chamber 17, and an inner pod opener 21 which is arranged on a second side face of the robot chamber 17. The interiors of the vacuum reticle library 19 and the inner pod opener 21 are vacuum environments and, the vacuum reticle library 19 and the inner pod opener 21 are arranged in a vacuum environment in a sub-chamber integrated with the robot chamber 17.

Furthermore, the reticle carrying system is provided with a load lock chamber 23 which is arranged on a third side face of the robot chamber 17, with an outer pod opener 31 and an atmospheric reticle library 35 which are arranged under the atmospheric environment outside the load lock chamber 23, and with first and second atmospheric robots 33, 29. The load lock chamber 23 is in communication with the atmosphere through a first gate valve 27 and in communication with the robot chamber 17 through a second gate valve 25. Stages of the openers 21, 31, and portions of the robots 15, 29, and 33 to come into contact with the inner pod are made of an electroconductive material and are grounded through a ground line.

In the reticle carrying system, the atmospheric reticle library 35 stores reflective reticles R for EUV light to be used in the exposure apparatus EX, each of which is set as kept and protected in a reticle pod 20. The reticle pod 20 is a so-called double pod composed of an inner pod 41 which keeps the reticle R therein, and an outer pod 39 which keeps the inner pod 41 therein (the details of which will be described later). The outer pod 39 protects the reticle R under the atmospheric environment and the inner pod 41 protects the reticle R mainly under the vacuum environment (or in a depressurized atmosphere).

Figure 2A:
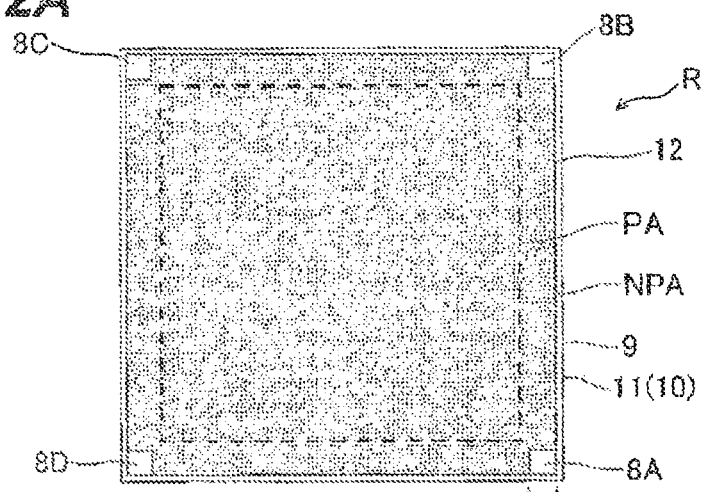
FIG. 2A is a drawing showing a reticle in the first embodiment, FIG. 2B an enlarged side view showing a part of FIG. 2A, FIG. 2C an enlarged side view showing a state in which an electric conduction member is brought into contact with a ground region of the reticle, and FIG. 2D an enlarged side view showing a major part of the reticle in a modification example.
Figure 2B:
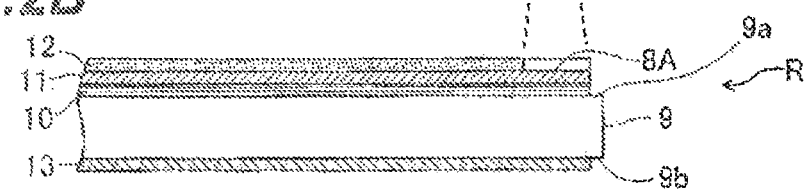

FIG. 2A shows a pattern surface of the reticle R in the present embodiment and FIG. 2B shows an enlarged side view of a part of the reticle R. In FIG. 2B, the reticle R has: a tabular substrate 9 of a substantially rectangular or square shape comprised, for example, of quartz; an electroconductive multilayer film 10 formed on the pattern surface 9a being a front surface of the substrate 9 and comprised of molybdenum (Mo) and silicon (Si); an electroconductive first absorption film 11 formed on the multilayer film 10 and comprised of tantalum boride nitride (TaBN); and an electrically insulating second absorption film 12 formed on the first absorption film 11 and comprised of tantalum boride oxide (TaBO). Furthermore, an electroconductive film 13 comprised of metal is formed on a back surface 9b of the substrate 9. The reticle R is gripped through the electroconductive film 13 by an electrostatic chuck (not shown) of the exposure apparatus.

The multilayer film 10 of the reticle R is a reflective film which reflects the EUV light and the absorption films 11, 12 are absorbing layers (absorbers) which absorb the EUV light. In FIG. 2A, a master pattern (circuit pattern) for transfer and alignment marks (not shown) are formed by partially removing the absorption films 11, 12, in a substantially rectangular or square pattern area PA in a central region, of a region where the multilayer film 10 and the absorption films 11, 12 are formed (which is a region covering most of the pattern surface 9a of the substrate 9). Furthermore, of the region where the multilayer film 10 and the absorption films 11, 12 are formed, corner regions at four locations in a non-pattern area NPA of a frame shape in the periphery around the pattern area PA are defined as ground regions 8A, 8B, 8C, and 8D from which the insulating second absorption film 12 is removed. Since the electroconductive first absorption film 11 is exposed in the ground regions 8A-8D, the pattern surface 9a of the reticle R can be stably grounded by grounding the ground regions 8A-8D. In the present embodiment, since the multilayer film 10 is also electrically conductive, the first absorption film 11 may also be removed together with the second absorption film 12, in the ground regions 8A-8D.

It is noted that the multilayer film 10 may be another multilayer film of a combination of a material such as ruthenium (Ru), rhodium (Rh), or lanthanum (La) with a material such as Si, beryllium (Be), or carbon tetraboride ($B_4C$). Furthermore, the first absorption film 11 may be one made of another electroconductive material such as Ta, nickel (Ni), or chromium (Cr). Furthermore, the second absorption film 12 is formed for achieving detection contrast between the multilayer film and the absorption film, necessary for a pattern tester using the wavelength other than the EUV light. In the present embodiment, tantalum boride oxide (TaBO) is used for it but another material except for it may be used. In addition, the electroconductive film 13 on the back surface is made, for example, of chromium nitride (CrN) or chromium (Cr) or the like, but it may be made of another material except for them.

Figure 3:
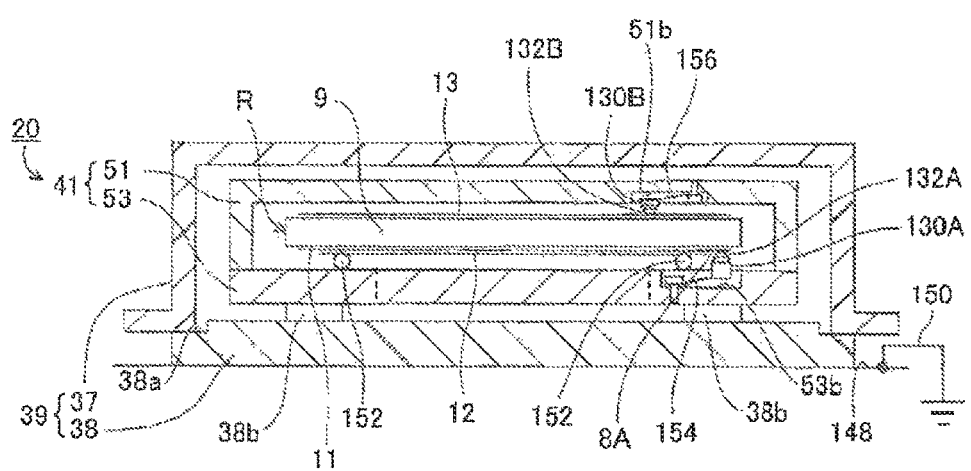
FIG. 3 is a cross-sectional view showing a reticle pod in the first embodiment.
Figure 4:
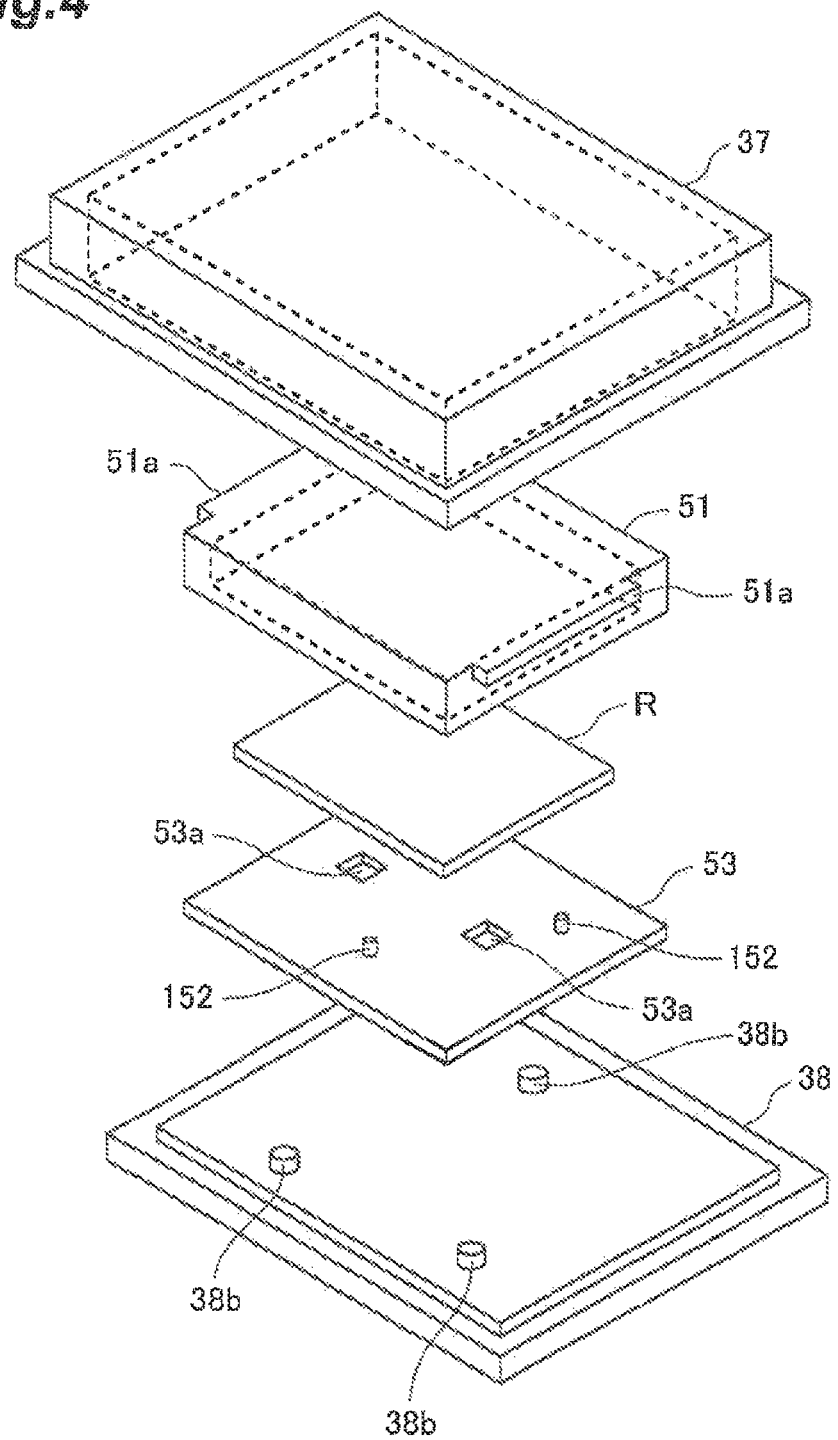
FIG. 4 is a perspective view showing a state in which members of the reticle and the reticle pod are disengaged.

Next, FIG. 3 is a cross-sectional view showing a state in which the reticle R in FIG. 2A is kept in the reticle pod 20 in FIG. 1 and FIG. 4 a perspective view showing a state in which the members of the reticle R and the reticle pod 20 are disengaged. In FIG. 3, the reticle pod 20 is composed of an inner pod 41 keeping the reticle R therein, and an outer pod 39 keeping the inner pod 41 therein. The outer pod 39 has a tabular outer door 38 of a rectangular shape on which the inner pod 41 is mounted, and an outer dome 37 of a rectangular box shape with an opening bottom, which is mounted on the outer door 38 so as to cover the inner pod 41 on the outer door 38. A low step 38a is formed in the peripheral part of the outer door 38 and projecting seats 38b are formed at a plurality of locations (e.g., at three locations) on the top surface of the outer door 38. A flange portion at the lower end of the outer dome 37 is mounted on the step 38a and the inner pod 41 is mounted on the seats 38b. The outer dome 37 and outer door 38 are made of an electroconductive synthetic resin such as polyacetylene, polypyrrole, polythiophene, polyaniline, or carbon-containing polycarbonate, as an example. Furthermore, as an example, the seats 38b are formed integrally with the outer door 38, whereby top surfaces of the seats 38b and a bottom surface of the outer door 38 are in electric conduction. As an example, the outer door 38 is mounted on a top surface of a metal member 148 of the atmospheric robot 33 or the like and the member 148 is grounded through a ground line 150.

Furthermore, the inner pod 41 has a tabular base plate 53 of a rectangular shape on which the reticle R is mounted, and a cover member 51 of a rectangular box shape with an opening bottom, which is mounted on the base plate 53 so as to cover the reticle R on the base plate 53. The cover member 51 and the base plate 53 are made of a metal such as titanium (Ti), aluminum (Al), or stainless steel as an example. In the present embodiment, therefore, the cover member 51 and the base plate 53 are electrically conductive. Furthermore, support members 152 of a flexible structure comprised of a material, e.g., such as synthetic resin more flexible than metal are stuck at a plurality of locations (e.g., at three locations) on a top surface of the base plate 53. The pattern surface of the reticle R is mounted on the support members 152.

As shown in FIG. 4, windows 53a consisting of three rectangular openings are formed in the base plate 53 and flange portions 51a for supporting the cover member 51 are formed on a pair of opposed side faces of the cover member 51. The windows 53a are used for detecting pre-alignment marks or the like of the reticle R.

In FIG. 3, a recess 53b is formed in the top surface of the base plate 53, a metal leaf spring 154 is fixed in the recess 53b with a bolt, and a metal electric conduction member 130A of a circular cylindrical shape is fixed to an apical end of the leaf spring 154. At the tip of the electric conduction member 130A, a hemispherical contact portion 132A more flexible than metal, which is comprised of an electroconductive synthetic resin such as polyacetylene, polypyrrole, polythiophene, polyaniline, or carbon-containing polyimide, is fixed thereto, for example, through an electroconductive adhesive or the like. The contact portion 132A is biased from the base plate 53 toward the reticle R by the leaf spring 154. The pattern surface of the reticle R in the present embodiment is provided with the ground regions 8A-8D where the electroconductive first absorption film 11 is exposed, and the positions of the recess 53b and the leaf spring 154 are set so as to bring the contact portion 132A into contact with the ground region 8A.

Furthermore, a recess 51b is formed in the inner surface of the cover member 51, a metal leaf spring 156 is fixed in the recess 51b with a bolt, an electric conduction member 130B similar to the electric conduction member 130A is fixed to an apical end of the leaf spring 156, and an electroconductive contact portion 132B more flexible than metal, which is similar to the contact portion 132A, is fixed to the tip of the electric conduction member 130B. The contact portion 132B is biased from the cover member 51 toward the electroconductive film 13 on the back surface of the reticle R by the leaf spring 156. The contact portion 132B is in electric conduction through the electric conduction member 130B, leaf spring 156, and cover member 51 to the base plate 53. Similarly, the contact portion 132A is in electric conduction through the electric conduction member 130A and the leaf spring 154 to the base plate 53 and the base plate 53 is grounded through the seats 38b, the outer door 38, and the member 148. In the present embodiment, therefore, when the outer door 38 is grounded, the pattern surface (first absorption film 11) and the back surface (electroconductive film 13) of the reticle R kept in the inner pod 41 in the outer pod 39 are grounded through the contact portions 132A and 132B, respectively, thereby surely preventing the electrostatic destruction of the pattern and the electrostatic adhesion of foreign matter.

Furthermore, since the contact portions 132A, 132B are made of the electroconductive resin more flexible than metal, the contact portions 132A, 132B are brought into contact with or away from the ground region 8A and the electroconductive film 13, respectively, without breakage of the first absorption film 11 or the electroconductive film 13 into fine pieces (powder) as foreign matter. Therefore, it is feasible to prevent circuit defect due to adhesion of such foreign matter to the pattern surface of the reticle R and flatness defect in gripping by the electrostatic chuck due to adhesion of such foreign matter to the back surface of the reticle R.

The following will describe a configuration of the exposure apparatus EX using the EUV light as exposure light in the present embodiment.

Figure 5:
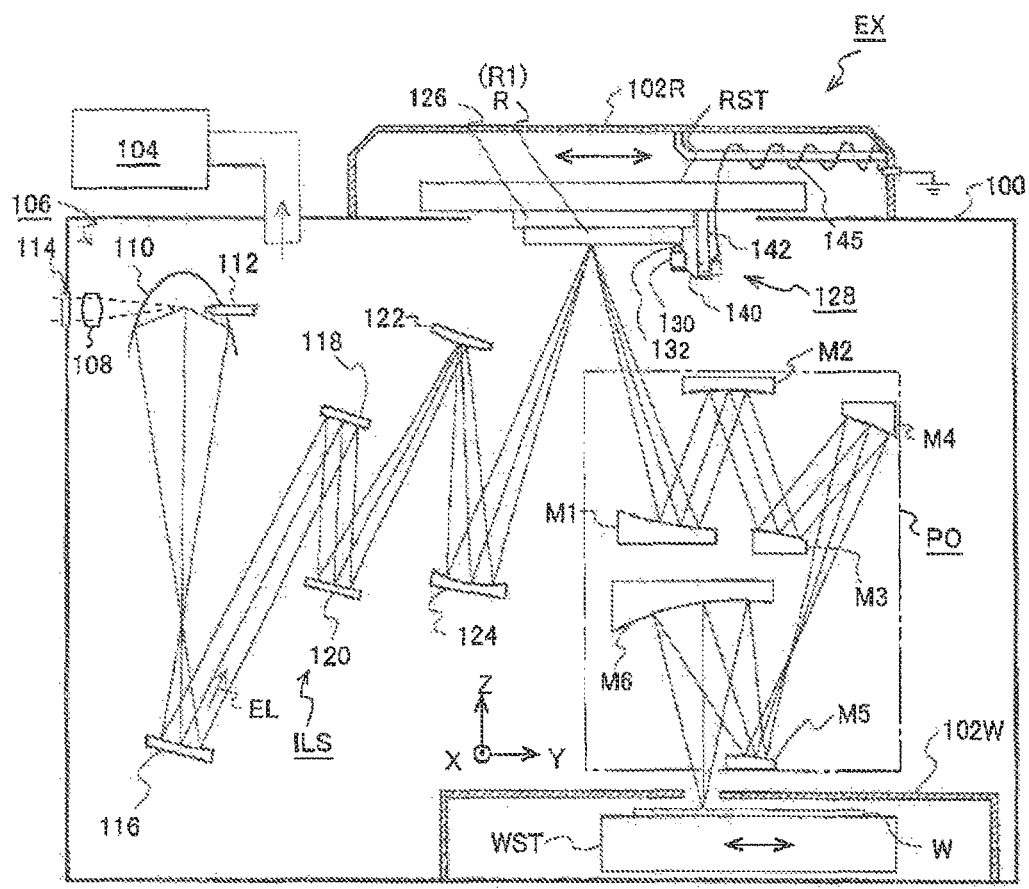
FIG. 5 is a cross-sectional view showing an exposure apparatus in the first embodiment.

FIG. 5 is a cross-sectional view schematically showing an overall configuration of the exposure apparatus EX. In FIG. 5, the exposure apparatus EX is provided with a laser plasma light source 106 which generates pulses of exposure light EL, an illumination optical system ILS which illuminates an illumination region on the pattern surface of the reticle R (mask) with the exposure light EL, a reticle stage RST which moves the reticle R, and a projection optical system PO which projects an image of a pattern in the illumination region on the reticle R onto a surface of a wafer (semiconductor wafer) W coated with a resist (photosensitive material). Furthermore, the exposure apparatus EX is provided with a wafer stage WST which moves the wafer W, a main control system (not shown) which generally controls the operation of the whole apparatus, and so on.

In order to prevent the EUV light from being absorbed by gas, the exposure apparatus EX is almost entirely housed in the exposure chamber 100 of the box shape and is provided with a large-size vacuum pump 104 for evacuating the space inside the exposure chamber 100. As an example, the pressure in the exposure chamber 100 is approximately $10^{-5}$ Pa and the pressure in a sub-chamber (not shown) housing the projection optical system PO inside the exposure chamber 100 is approximately $10^{-5}$ to $10^{-6}$ Pa.

The description hereinafter is based on the following definition: in FIG. 5, Z-axis is taken along a direction of a normal to a surface on which the wafer stage WST is mounted (a bottom surface of the exposure chamber 100), X-axis is taken perpendicularly to the plane of FIG. 5 in a plane perpendicular to the Z-axis (a plane approximately parallel to a horizontal plane in the present embodiment), and Y-axis is taken in parallel to the plane of FIG. 5. In the present embodiment, the reticle R and the wafer W are scanned in synchronism in the Y-direction (scanning direction) with respect to the projection optical system PO during exposure operation.

First, the laser plasma light source 106 is a light source of a gas jet cluster method which is provided with a high-power laser light source (not shown), a condensing lens 108 which condenses laser light supplied from this laser light source through a window member 114 of the exposure chamber 100, a nozzle 112 which ejects a target gas such as xenon, and a focusing mirror 110. The exposure light EL emitted as pulsed from the laser plasma light source 106 is incident to the illumination optical system ILS. The illumination optical system ILS has mirrors 116, 118, 120, 122, and 124, an aperture stop (not shown), and a field stop (not shown) and illuminates the illumination region, for example, of an arcuate shape on the pattern surface of the reticle R obliquely from underneath with the exposure light EL in an even illuminance distribution.

Next, the reticle R is held as gripped through an electrostatic chuck 126 on the bottom surface of the reticle stage RST. The reticle stage RST is driven at a predetermined stroke at least in the Y-direction by a drive system (not shown), for example, consisting of a magnetic levitation type two-dimensional linear actuator, along a guide surface parallel to the XY plane on the outer surface of the exposure chamber 100, based on measurements of laser interferometers (not shown). A partition 102R is provided so as to cover the reticle stage RST to the exposure chamber 100 side and the interior of the partition 102R is maintained at a pressure between the atmospheric pressure and the pressure in the exposure chamber 100 by an unrepresented vacuum pump.

Furthermore, the electroconductive film 13 on the back surface of the reticle R (cf. FIG. 2B) is gripped by the electrostatic chuck 126 and the electroconductive film 13 is grounded through a grounding mechanism (not shown) in the electrostatic chuck 126. Furthermore, the exposure apparatus EX is provided with a grounding mechanism 128 for grounding the pattern surface (front surface) of the reticle R gripped by the electrostatic chuck 126. The grounding mechanism 128 has a support member 142 fixed to the reticle stage RST, a metal leaf spring 140 one end of which is fixed to the support member 142, an electric conduction member 130 which is fixed to the other end of the leaf spring 140, and an electroconductive contact portion 132 which is fixed to the tip of the electric conduction member 130 and which is capable of coining into contact with the pattern surface of the reticle R. The electric conduction member 130 and contact portion 132 are made of the same materials as the electric conduction member 130A and the contact portion 132A, respectively, in FIG. 3. The contact portion 132 is grounded through the electric conduction member 130, the leaf spring 140, and a ground line 145. The contact portion 132 is biased toward the reticle R by the leaf spring 140 and there is also a drive mechanism (not shown) provided for moving the contact portion 132 away from the reticle R.

Figure 2C:
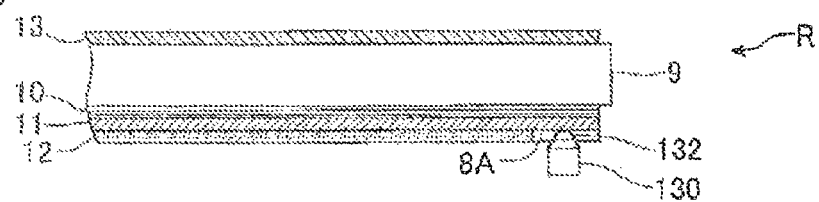

As shown in FIG. 2(C), the contact portion 132 of the grounding mechanism 128 is in contact with the electroconductive first absorption film 11 of the ground region 8A on the pattern surface of the reticle R. The pattern surface of the reticle R is grounded through the contact portion 132. Since the contact portion 132 is made of the electroconductive resin more flexible than metal, the contact portion 132 is brought into contact with or away from the ground region 8A, without breakage of the first absorption film 11 into fine pieces (powder) as foreign matter. It is noted that the dispersal distance of such foreign matter is not more than about 10 mm in the atmospheric pressure whereas the dispersal distance of such foreign matter is not less than several ten meters in a high vacuum state as in the exposure chamber 100, raising a possibility of adhesion of foreign matter even to the pattern in the pattern area PA. For example, while the foreign matter floats in the exposure chamber 100, the foreign matter can also adhere to the pattern in the pattern area PA.

In the present embodiment, however, since the ground region 8A of the reticle R is grounded through the contact portion 132 more flexible than metal, it is feasible to significantly suppress production of foreign matter due to grounding of the pattern surface of the reticle R and significantly reduce the pattern defect.

In FIG. 5, the exposure light EL reflected on the illumination region on the reticle R travels toward the projection optical system PO. The projection optical system PO is, as an example, a reflective optical system which is configured by holding six mirrors M1 to M6 by an unrepresented cylinder and which is non-telecentric on the object plane (pattern surface of the reticle R) side and almost telecentric on the image plane (front surface of the wafer W) side, and its projection magnification is a reduction magnification such as ¼. The exposure light EL reflected on the illumination region of the reticle R forms a demagnified image of a part of the pattern of the reticle R, in an exposure region on the front surface of the wafer W via the projection optical system PO.

Furthermore, the wafer W is held as gripped on the top of the wafer stage WST through an electrostatic chuck (not shown). The wafer stage WST is arranged on a guide surface set along the XY plane. The wafer stage WST is driven at a predetermined stroke at least in the X-direction and the Y-direction, for example, by a drive system (not shown) consisting of a magnetic levitation type two-dimensional linear actuator, based on measurements of laser interferometers (not shown). In order to prevent gas evolving from the resist of the wafer W during the exposure operation from adversely affecting the mirrors M1-M6 of the projection optical system PO, the wafer W is arranged inside a partition 102W. An aperture for letting the exposure light EL pass through it is formed in the partition 102W and the space in the partition 102W is evacuated by another vacuum pump (not shown). In addition thereto, the apparatus is also provided with alignment systems (not shown) for the reticle R and the wafer W.

For implementing exposure in one die (shot area) on the wafer W, the illumination optical system ILS illuminates the illumination region on the reticle R with the exposure light EL and, the reticle R and the wafer W are moved in synchronism (or synchronously scanned) at a predetermined speed ratio according to the reduction magnification of the projection optical system PO in the Y-direction with respect to the projection optical system PO. Thereafter, the wafer stage WST is driven to implement step movement of the wafer W in the X-direction and the Y-direction and then the next die on the wafer W is subjected to scanning exposure with the pattern of the reticle R. In this manner a plurality of dies on the wafer W are sequentially exposed with the pattern of the reticle R by the step-and-scan method.

The below will describe an example of operation of the reticle carrying system in FIG. 1. The reticle pod 20 (outer pod 39) placed in the atmospheric reticle library 35 is carried to the outer pod opener 31 by the first atmospheric robot 33. In this outer pod opener 31, an outer pod ID reader 43 reads a bar code on the outer pod 39 to identify the outer pod 39. Thereafter, the outer pod 39 is opened and the inner pod 41 is taken out thereof.

Figure 6A:
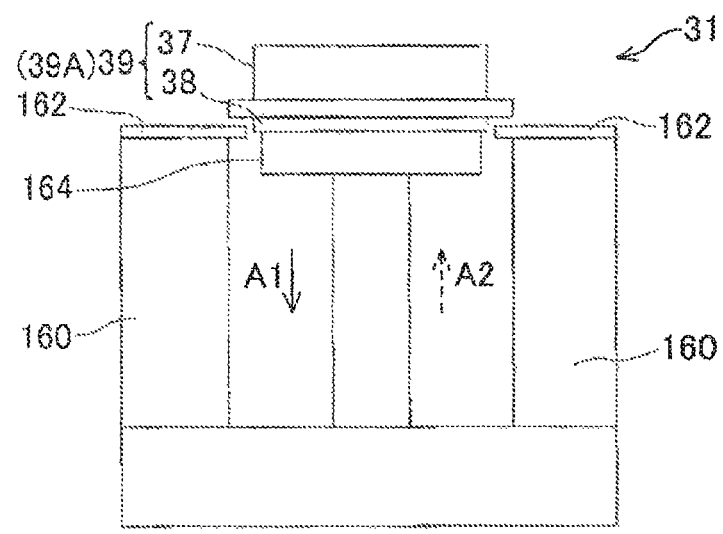
FIG. 6A is a front elevation showing an outer pod opener and FIG. 6B a front elevation showing a state in which an outer dome and an outer door of an outer pod are disengaged.
Figure 6B:
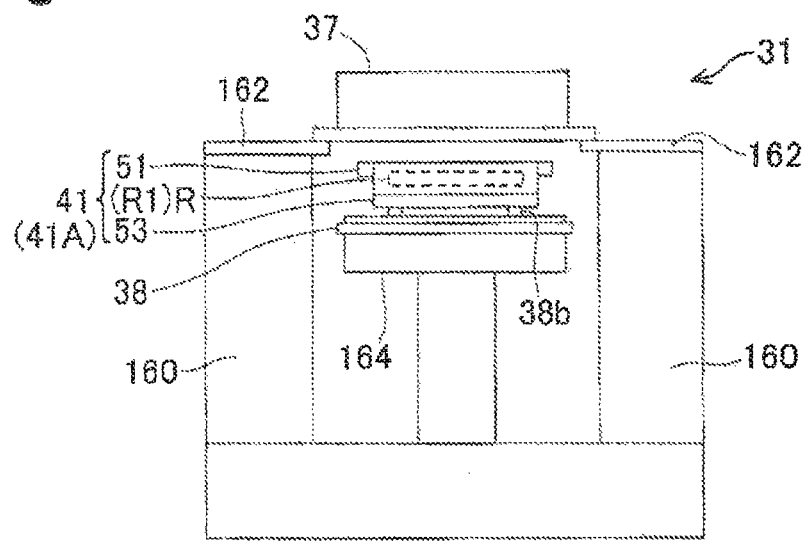

As shown in FIG. 6A, the outer pod 39 thus carried is mounted on a grounded stage 164 of the outer pod opener 31. The stage 164 is lowered from this state as indicated by a solid arrow A1, whereby the flange portion of the outer dome 37 becomes mounted on catch members 162 at the upper end of a support member 160 and the inner pod 41 with the reticle R kept therein appears, as shown in FIG. 6B. Since the reticle R is grounded through the contact portions 132A, 132B and the seats 38b and others in FIG. 3, the electrostatic destruction of the pattern and the electrostatic adhesion of foreign matter are prevented with certainty.

After that, the inner pod 41 on the stage 164 is taken out by the second atmospheric robot 29 in FIG. 1. In the case of bringing the inner pod 41 with the reticle R having been used in exposure, into the outer pod 39, the inner pod 41 is mounted on the stage 164 as shown in FIG. 6B. Thereafter, the stage 164 is lifted up, as indicated by a dotted arrow A2 in FIG. 6A.

In FIG. 1, the inner pod 41 taken out by the second atmospheric robot 29 is heated by a temperature compensation lamp 45 to raise its temperature by about 2 to 3° C. The temperature-raised inner pod 41 is carried by the second atmospheric robot 29 to the load lock chamber 23 in a state in which only the first gate valve 27 is opened. It is noted that the route from the outer pod opener 31 to the load lock chamber 23 is a clean atmosphere at the atmospheric pressure.

In the load lock chamber 23, the interior space is vacuumized together with the inner pod 41, with the gate valves 27 and 25 being closed. When the interior of the load lock chamber 23 reaches a predetermined vacuum state, only the second gate valve 25 is opened and the inner pod 41 is carried to the vacuum reticle library 19 by the vacuum robot 15. In the vacuum reticle library 19, for example, about five reticles R are reserved in a state in which each reticle is kept in the inner pod 41. The reticles R are maintained at a predetermined temperature by a temperature regulating mechanism (not shown). The reticles R each of which is kept in the inner pod 41 are identified by a reticle ID reader 47. The reticle R to be used in the exposure apparatus EX is carried by the vacuum robot 15 to the inner pod opener 21 in the state in which the reticle R is kept in the inner pod 41.

Figure 7A:
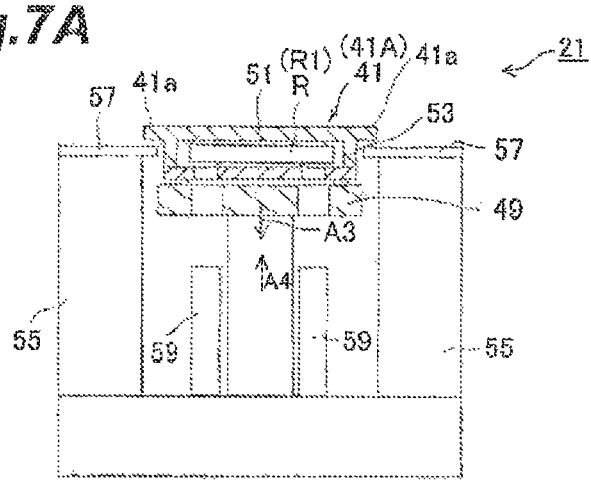
FIG. 7A is a cross-sectional view showing an inner pod opener, FIG. 7B a cross-sectional view showing a state in which a cover member and a base plate of an inner pod are disengaged, and FIG. 7C a drawing showing a state in which the reticle is to be gripped by an electrostatic chuck.

In the inner pod opener 21, the inner pod 41 is opened whereby the reticle R appears. In the present embodiment, as shown in FIG. 7A, the inner pod 41 carried into the inner pod opener 21 is mounted on a grounded stage 49. The stage 49 is moved down as indicated by a solid arrow A3, whereby the flange portions 51a of the cover member 51 become mounted on catch members 57 at the upper end of a support member 55 and the reticle R appears, as shown in FIG. 7B.

A pair of alignment systems 59 of an image processing method for pre-alignment of the reticle R are arranged below the stage 49. The alignment systems 59 detect pre-alignment marks RM1, RM2 provided on the pattern surface of the reticle R, through through-holes 49a formed in the stage 49 and through the windows 53a provided in the base plate 53, thereby to detect the two-dimensional position of the reticle R. At this time, the reticle ID such as a bar code provided on the reticle R is detected through the window 53a, whereby the reticle ID can be identified.

Figure 7B:
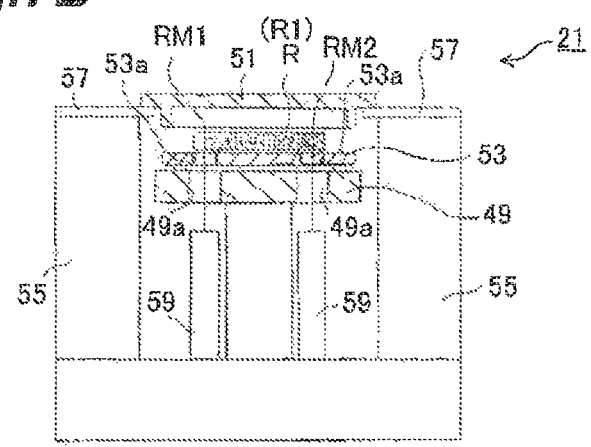
Figure 7C:
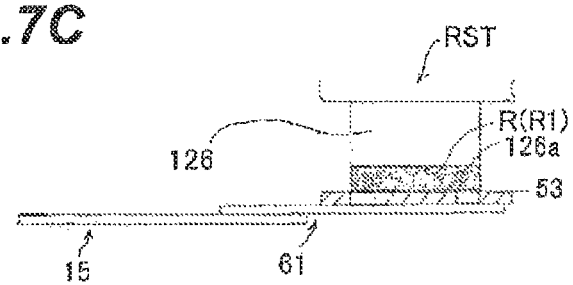

After completion of the pre-alignment, the reticle R is carried by a carry arm 61 of the vacuum robot 15 to the reticle stage RST of the exposure apparatus EX, as shown in FIG. 7C, in the state in which it is mounted on the base plate 53 of the inner pod 41. The electrostatic chuck 126 is attached to the reticle stage RST with its grip surface 126a facing down. Then, while the back surface of the reticle R is pushed against the grip surface 126a of the electrostatic chuck 126 through the base plate 53 by the carry arm 61, the electrostatic chuck 126 is turned on, whereby the reticle R is gripped by the electrostatic chuck 126. Thereafter, the ground region 8A of the reticle R is grounded by the grounding mechanism 128 in FIG. 5 and exposure is carried out in this state.

After the gripping of the reticle R, the carry arm 61 carries the base plate 53 to the inner pod opener 21 and mounts the base plate 53 on the stage 49 located at the down position, as shown in FIG. 7B (note: the reticle R is not mounted thereon in this state; the same also applies to the following). Then, as indicated by a dotted arrow A4 in FIG. 7A, the stage 49 is raised to bring the base plate 53 into close contact with the cover member 51. The closed inner pod 41 remains on standby in the inner pod opener 21, for example, in that state during the exposure operation.

For replacing the reticle R on the reticle stage RST after completion of the exposure, the base plate 53 is mounted on the carry arm 61 and, as shown in FIG. 7C, the base plate 53 is moved to the vicinity of a replacement position of the reticle R. Then, the contact portion 132 of the grounding mechanism 128 is moved away from the reticle R gripped by the electrostatic chuck 126, the base plate 53 is brought into contact with the reticle R through the carry arm 61, and the electrostatic chuck 126 is turned off to transfer the reticle R onto the base plate 53. Since the carry arm 61 is also grounded, the pattern surface of the reticle R is again grounded. After this, the base plate 53 and the reticle R are carried to the inner pod opener 21 by the carry arm 61 and, as shown in FIG. 7B, the base plate 53 is mounted onto the stage 49 at the down position. Thereafter, the stage 49 is moved up to bring the cover member 51 into close contact on the base plate 53 so as to cover the reticle R on the base plate 53, and the inner pod 41 is closed in the state in which the reticle R is kept in the inner pod 41. Furthermore, the electroconductive film 13 on the back surface of the reticle R is also grounded through the cover member 51.

As described above, the reticle pod 20 in the present embodiment is provided with the inner pod 41 capable of keeping the reticle R therein, the outer pod 39 capable of keeping the inner pod 41 therein, the electroconductive movable contact portion 132A provided on the inner pod 41 and being capable of coining into contact with the ground region 8A of the reticle R, and the leaf spring 154 for achieving electric conduction between the base plate 53 (inner pod 41) which is the contact portion of the inner pod 41 with the outer pod 39, and the contact portion 132A.

With this reticle pod 20, the reticle R can be stably grounded by grounding the outer pod 39 and housing the inner pod 41 with the reticle R kept therein in the outer pod 39.

Furthermore, the exposure apparatus EX using the EUV light as exposure light in the present embodiment is provided with the reticle stage RST capable of gripping to hold the reticle R in the present embodiment, the electroconductive movable contact portion 132 provided on the reticle stage RST and being capable of coining into contact with the ground region 8A of the reticle R, and the ground line 145 for grounding the contact portion 132.

With this exposure apparatus EX, the substrate 9 of the reticle R held on the reticle stage RST can be stably grounded. Therefore, it can prevent the electrostatic destruction of the pattern of the reticle R and the electrostatic adhesion of foreign matter to the pattern surface or the like.

It is noted that, instead of the movable contact portion 132, an electroconductive grounded member like a reed screen may be supported on the reticle stage RST and this reed-screen-like member is arranged so as to be capable of coining into contact with the ground region 8A of the reticle R. This also allows the reticle R to be stably grounded.

Furthermore, the reticle pod 20 in the present embodiment can also be regarded as a constitutive member of the exposure apparatus EX. In this case, the exposure apparatus EX is provided with the reticle pod 20 and the reticle stage RST for holding the reticle R carried with the use of the reticle pod 20. In this case, the reticle stage RST does not always have to be provided with the movable contact portion 132 or a substitute member for it.

Furthermore, in the reticle pod 20 in the present embodiment, since the contact portion 132A in FIG. 3 is supported on the inner pod 41, the substrate 9 of the reticle R can be stably grounded, for example, even during the operation of carrying the inner pod 41 by the vacuum robot 15. It is noted that the device may be configured as follows: an opening is formed in the base plate 53 of the inner pod 41, the contact portion 132A is movably supported through a leaf spring or the like on the outer door 38 of the outer pod 39, and the contact portion 132A is brought into contact with the ground region 8A of the reticle R through the opening. In this case, the substrate 9 of the reticle R can also be stably grounded during periods in which the inner pod 41 is kept in the outer pod 39. Furthermore, the device may also be configured, for example, in such a configuration that there are two contact portions 132A capable of coining into contact with the ground regions 8A, 8B of the reticle R, one contact portion 132A is movably supported on the base plate 53, and the other contact portion 132A is movably supported on the outer door 38.

Furthermore, in the present embodiment, since the cover member 51 opposed to the back surface of the substrate 9 of the reticle R in the inner pod 41 is also provided with the movable contact portion 132B, the electroconductive film 13 on the back surface of the substrate 9 can also be stably grounded. It is noted, for example, that an electroconductive film for achieving electric conduction between the electroconductive film 13 on the back surface and the multilayer film 10 (electroconductive film) on the pattern surface may be formed on a side face of the substrate 9. This configuration makes it possible to omit the contact portion 132B on the cover member 51 side and others.

Furthermore, in the present embodiment the ground regions 8A-8D of the reticle R are arranged in the vicinity of the four corners of the substrate 9, but the positions of the ground regions may be changed, for example, depending upon types of reticles R. In conjunction therewith, the grounding mechanism 128 on the exposure apparatus EX side is preferably provided with an adjustment mechanism for adjusting the position of the contact portion 132, as shown in a modification example of FIG. 2D.

When the support members 152 placed on the base plate 53 are made of an electroconductive resin such as carbon-containing polyimide and the electroconductive film is exposed at corresponding positions on the reticle pattern surface, it becomes possible to omit the recess 53b, the leaf spring 154, and the electric conduction member 130A forming the electric conduction mechanism for the pattern surface.

Figure 2D:
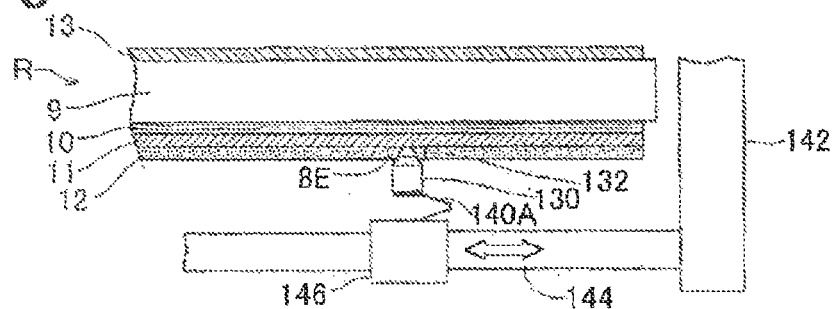

In FIG. 2D, a ground region 8E where the first absorption film 11 is exposed is provided in one peripheral region outside the pattern area on the substrate 9 of the reticle R. Information of the position of the ground region 8E is supplied to the main control system (not shown) of the exposure apparatus EX, for example, together with information of an illumination condition for the reticle R and others. On the exposure apparatus EX side, a guide member 144 is fixed to a support member 142 provided on the reticle stage RST, a slide portion 146 is arranged so that it can be driven along the guide member 144 by a drive unit (not shown), and the electric conduction member 130 and contact portion 132 are attached through a leaf spring 140A to the slide portion 146. The contact portion 132 is grounded through the ground line 145 in FIG. 5. Then, the slide portion 146 is moved to move the contact portion 132 to the position where it is opposed to the ground region 8E, and a release mechanism (not shown) is used to allow the leaf spring 140A to bias the contact portion 132 toward the reticle R, whereby the contact portion 132 comes into contact with the ground region 8E, so as to stably ground the substrate 9 of the reticle R.

Second Embodiment

Next, the second embodiment will be described with reference to FIGS. 8A and 8B. The reticle pod in the present embodiment also keeps a reticle R1 to be used in the exposure apparatus EX in FIG. 1, therein and is carried by the reticle carrying system in FIG. 1. In the present embodiment, however, the grounding mechanism 128 of the exposure apparatus EX does not always have to be provided. It is noted that portions in FIGS. 8A and 8B corresponding to those in FIG. 2B and FIG. 3 will be denoted by the same reference signs and the detailed description thereof will be omitted.

FIG. 8A is a cross-sectional view showing a reticle pod 20A of the double pod system which keeps the reticle R1 of the present embodiment therein. In FIG. 8A, the electroconductive multilayer film 10 to reflect the exposure light and the first absorption film 11 and second absorption film 12 with the electrically conductive and insulating properties to absorb the exposure light are formed on the pattern surface of the substrate 9 of the reticle R1, and the absorption films 11, 12 are partly removed in the pattern area to form the pattern for transfer. However, the reticle R1 in the present embodiment is not provided with the ground regions where the first absorption film 11 or the multilayer film 10 is exposed.

Furthermore, the reticle pod 20A is composed of an inner pod 41A which keeps the reticle R1 therein and an outer pod 39A which keeps the inner pod 41A therein. The outer pod 39A has the outer door 38 and the outer dome 37 which is mounted on the outer door 38 so as to cover the inner pod 41A on the seats 38b of the outer door 38. As an example, the outer dome 37 and outer door 38 are made of an electroconductive resin. In FIG. 8A, the outer door 38 is grounded through the metal member 148 and the ground line 150.

The inner pod 41A has the base plate 53 on which the reticle R1 is to be mounted through the support members 152, and the cover member 51 which is mounted on the base plate 53 so as to cover the reticle R1. As an example, the cover member 51 and base plate 53 are made of metal.

In the present embodiment, an opening 53c is formed at a position opposite to the second absorption film 12 provided on the substrate 9 of the reticle R1, in the peripheral region of the base plate 53 of the inner pod 41A, and a conical electroconductive conduction pin 72A with its pointed end being directed toward the reticle R1 is fixed to the tip of a metal leaf spring 71A which is fixed to the base plate 53 with a bolt in the vicinity of the opening 53c. The conduction pin 72A is supported so as to be vertically displaceable in the opening 53c. The conduction pin 72A is, as an example, one wherein a small hemispherical member made of an electroconductive material harder than metal, e.g., electroconductive ceramics such as electroconductive diamond or electroconductive zirconia is fixed to the tip of a main body part made of metal such as titanium. The electroconductive diamond is, for example, diamond doped with boron. The conduction pin 72A and the leaf spring 71A constitute an electric conduction mechanism 70A.

In the outer door 38 of the outer pod 39A, a recess 38c is formed at a position opposite to the opening 53c of the base plate 53 and a biasing mechanism 76 is fixed to an apical end of a leaf spring 75 fixed in the recess 38c with a bolt, so as to bias the conduction pin 72A toward the reticle R1. The biasing member 76 and the leaf spring 75 constitute a biasing mechanism 74. The biasing mechanism 74 biases the conduction pin 72A toward the reticle R1 by a force slightly smaller than the weight of the reticle R1. The position where the conduction pin 72A is in contact with the reticle R1 is located outside of the circuit pattern area (e.g., 104 mm×132 mm) of the reticle and is preferably located outside of the quality area QA (e.g., 142 mm×142 mm) defined by SEMI (Semiconductor Equipment and Materials International) Standard.

When the biasing mechanism 74 biases the apical end of the conduction pin 72A toward the reticle R1, the conduction pin 72A easily passes through (or breaks) the second absorption film 12 on the substrate 9 of the reticle R1 to reach the electroconductive first absorption film 11 or the electroconductive multilayer film 10 below it. In this state, the pattern surface of the reticle R1 is electrically conductive to the outer door 38 through the electric conduction mechanism 70A and the base plate 53. It is noted, however, that without the biasing force acting from the outside on the conduction pin 72A, the conduction pin 72A is retracted to a position where it is out of contact with the reticle R1, by the restoring force of the leaf spring 71A (cf. FIG. 8B).

Furthermore, in the cover member 51 of the inner pod 41A, an opening 51b is formed at a position opposite to the electroconductive film 13 on the back surface of the reticle R1 and a conical electroconductive conduction pin 72B with its pointed end being directed toward the reticle R1 is fixed to a central part of a metal leaf spring 71B which is fixed to the cover member 51 with a bolt in the vicinity of the opening 51b. The conduction pin 72B is supported so as to be vertically displaceable in the opening 51b. The conduction pin 72B is made of the same material as the conduction pin 72A. The conduction pin 72B and the leaf spring 71B constitute an electric conduction mechanism 70B. The position where the conduction pin 72B comes into contact with the reticle R1 is preferably located outside of the quality area QA (e.g., 142 mm×142 mm) defined by SEMI Standard and inside of a minimum coating area of electroconductive film (e.g., 146 mm×146 mm).

On the inner surface of the outer dome 37 of the outer pod 39A, a biasing member 78 is fixed at a position approximately opposite to the opening 51b of the cover member 51 and the biasing member 78 biases the free end of the leaf spring 71B of the conduction mechanism 70B toward the reticle R1. By this, the conduction pin 72B is biased so as to come into contact with the electroconductive film 13 of the reticle R1. When the biasing member 78 biases the apical end of the conduction pin 72B toward the electroconductive film 13 of the reticle R1, even if an oxide film is formed on the surface of the electroconductive film 13, the conduction pin 72B will easily pass through (or break) the oxide film to reach the electroconductive film 13. In this state, the back surface of the reticle R1 is electrically conductive to the outer door 38 through the conduction mechanism 70B, cover member 51, and base plate 53. It is noted, however, that without the biasing force acting from the outside on the conduction pin 72B, the conduction pin 72B is retracted to the position where it is out of contact with the reticle R1, by the restoring force of the leaf spring 71B (cf. FIG. 8B).

In the present embodiment, therefore, in the state in which the inner pod 41A keeping the reticle R1 therein is kept in the outer pod 39A and the outer door 38 is grounded, the pattern surface (the first absorption film 11 or the multilayer film 10) and the back surface (the electroconductive film 13) of the reticle R1 kept in the inner pod 41A are grounded through the conduction mechanisms 70A and 70B, respectively, so as to surely prevent the electrostatic destruction of the pattern and the electrostatic adhesion of foreign matter.

The below will describe an example of operation of carrying the reticle pod 20A (reticle R1) of the present embodiment by the reticle carrying system in FIG. 1. The reticle pod 20A (outer pod 39A) placed in the atmospheric reticle library 35 is carried to the outer pod opener 31 by the first atmospheric robot 33. As shown in FIG. 6A, the outer pod 39A thus carried is mounted on the grounded stage 164. In this state, the reticle R1 is grounded through the conduction mechanisms 70A, 70B and the seats 38b and others in FIG. 8A.

Thereafter, the stage 164 is moved down as indicated by the arrow A1, whereby the flange portion of the outer dome 37 becomes mounted on the catch members 162 at the upper end of the support member 160 and the inner pod 41A with the reticle R1 kept therein appears, as shown in FIG. 6B. At this time, as shown in FIG. 8B, the biasing member 78 is moved away from the leaf spring 71B provided on the cover member 51, whereby the conduction pin 72B is retracted upward as indicated by an arrow A6, by the restoring force of the leaf spring 71B. As a result, the back surface (electroconductive film 13) of the substrate 9 of the reticle R1 becomes electrically floating but there is no new charging with static electricity, thus causing no substantial electrostatic adhesion of foreign matter or the like.

Thereafter, the inner pod 41A on the stage 164 is taken out by the second atmospheric robot 29 in FIG. 1. At this time, as shown in FIG. 8B, the biasing mechanism 74 is moved away from the conduction pin 72A provided on the base plate 53, whereby the conduction pin 72A is retracted downward as indicated by an arrow A5, by the restoring force of the leaf spring 71A. As a result, the pattern surface (multilayer film 10) of the substrate 9 of the reticle R1 also becomes electrically floating but there is no new charging with static electricity, thus causing no substantial electrostatic destruction of the pattern or the like.

The inner pod 41A taken out by the second atmospheric robot 29 in FIG. 1 is carried under the vacuum environment through the load lock chamber 23 and vacuum robot 15, for example, to the inner pod opener 21. As shown in FIG. 7A, the inner pod 41A carried into the inner pod opener 21 is mounted on the grounded stage 49. The stage 49 is moved down as indicated by the arrow A3, whereby the flange portions 51a of the cover member 51 become mounted on the catch members 57 at the upper end of the support member 55 and the reticle R1 appears, as shown in FIG. 7B. On this occasion, the pre-alignment of the reticle R1 with the use of the alignment systems 59 and the identification of the reticle ID are carried out.

After completion of the pre-alignment, the reticle R1 is carried by the carry arm 61 of the vacuum robot 15 to the reticle stage RST of the exposure apparatus EX while being mounted on the base plate 53, as shown in FIG. 7C. Then, the reticle R1 is gripped by the electrostatic chuck 126 and exposure is performed. In returning the reticle R1 to the atmospheric reticle library 35 after completion of the exposure, the reticle R1 is brought into the inner pod 41A by steps opposite to the operation of FIG. 7A to 7C. Thereafter, the inner pod 41A is carried through the load lock chamber 23 by the second atmospheric robot 29 to be mounted on the grounded stage 164 of the outer pod opener 31 under the atmospheric environment, as shown in FIG. 6B. At this time, as indicated by an arrow A7 in FIG. 8B, the biasing member 76 of the outer door 38 upwardly biases the conduction pin 72A on the base plate 53 side of the inner pod 41A. As a result, the conduction pin 72A passes through (or breaks) the second absorption film 12 on the pattern surface of the reticle R1 to reach the electroconductive first absorption film 11 (or the multilayer film 10). By this, the pattern surface of the substrate 9 becomes grounded through the conduction mechanism 70A, base plate 53, and outer door 38.

After that, the stage 164 is moved up as indicated by the arrow A2 in FIG. 6A, whereby the biasing member 78 of the outer dome 37 comes to bias the conduction pin 72B downward through the leaf spring 71B on the cover member 51 side of the inner pod 41A, as indicated by an arrow A8 in FIG. 8B. As a result, even if an oxide film is formed on the surface of the electroconductive film 13 on the back surface of the substrate 9 of the reticle R1, the conduction pin 72B will pass through (or break) the oxide film on the back surface of the substrate 9 to reach the electroconductive film 13. By this, the back surface of the substrate 9 becomes grounded through the conduction mechanism 70B, cover member 51, base plate 53, and outer door 38. Therefore, the electrostatic destruction of the pattern of the reticle R1 and the electrostatic adhesion of foreign matter are prevented on a stable basis.

In the present embodiment, as described above, the contact and separation of the conduction pins 72A, 72B with and from the first absorption film 11 (or the multilayer film 10) and the electroconductive film 13 of the reticle R1 are carried out only under the atmospheric environment. In addition, the conduction pins 72A, 72B are maintained as separated from the reticle R1, under the vacuum environment. In this case, there is a possibility that, when the apical ends of the conduction pins 72A, 72B come into contact with the first absorption film 11 (multilayer film 10) or the electroconductive film 13 of the reticle R1 or when those apical ends are moved away from those members, fine pieces (powder) can be produced as foreign matter because of breakage of the first absorption film 11 or the oxide film or the like. The dispersal distance of such foreign matter is not more than about 10 mm in the atmospheric pressure whereas the dispersal distance of such foreign matter is not less than several ten meters in the vacuum state as in the exposure chamber 100, raising the possibility of the foreign matter also adhering to the pattern in the pattern area of the reticle R1. Furthermore, when the contact or the separation of the conduction pins 72A, 72B is performed in the state in which the reticle R1 is kept in the inner pod 41A and in the vacuum state, the dispersal distance of foreign matter is not less than several ten mm and there is a possibility that the foreign matter can also adhere to the pattern in the pattern area of the reticle R1.

Therefore, when the contact and the separation of the conduction pins 72A, 72B with and from the reticle R1 are always carried out only under the atmospheric environment, even if foreign matter is produced, the dispersal distance of the foreign matter will be short and the foreign matter will not reach the pattern area, thus preventing the defect of the pattern to be transferred.

The reticle pod 20A in the present embodiment, as described above, is provided with the inner pod 41A capable of keeping the reticle R1 therein, the outer pod 39A capable of keeping the inner pod 41A therein, the pair of movable electroconductive conduction pins 72A, 72B provided on the inner pod 41A and being capable of coining into contact with the electroconductive first absorption film 11 (or the multilayer film 10) on the pattern surface and the electroconductive film 13 on the back surface of the reticle R1, and the leaf springs 71A, 71B for achieving electric conduction between the conduction pins 72A, 72B and the base plate 53 (inner pod 41A).

Furthermore, in the reticle pod 20A, the outer door 38 of the outer pod 39A is electrically conductive and there is provided the electroconductive seats 38b for achieving electric conduction between the base plate 53 and the outer door 38. In the present embodiment, the seats 38b are integrated with the outer door 38.

In the present embodiment, the electroconductive movable conduction pins 72A, 72B provided on the inner pod 41A are brought into contact with the reticle R1, whereby the reticle R1 can be stably grounded through the outer door 38 of the outer pod 39A.

Furthermore, the reticle pod 20A in the present embodiment can also be regarded as a constitutive member of the exposure apparatus EX of FIG. 1 in the present embodiment. In this case, the exposure apparatus EX is provided with the reticle stage RST capable of gripping to hold the reticle R1 taken out of the reticle pod 20A. With the exposure apparatus EX, the conduction pins 72A, 72B are neither brought into contact with nor separated from the reticle R1 under the vacuum environment and for this reason, there is no foreign matter produced under the vacuum environment, so as to allow high-accuracy exposure of the wafer W with the pattern of the reticle R1.

It is noted that in the foregoing embodiment the insulating second absorption film 12 is formed on the pattern surface of the reticle R1, but the second absorption film 12 does not always have to be formed. For example, it is sufficient that the first absorption film be made of a material including a property for achieving sufficient detection contrast to the multilayer film, in the circuit pattern tester.

Furthermore, in the foregoing embodiment the conduction pins 72A, 72B to come into contact with the reticle R1 are supported on the inner pod 41A. It is noted that at least one of the conduction pins 72A, 72B may be attached, for example, through a leaf spring or the like to the outer door 38 and the outer dome 37 on the outer pod 39A side.

In the foregoing embodiment, the inner pod 41A is provided with the movable conduction pins 72A, 72B on the two surfaces of the reticle R1 and, for this reason, the two surfaces of the reticle R1 can be individually grounded on a stable basis. It is noted that, for example, when an electroconductive film for achieving electric conduction between the multilayer film 10 on the pattern surface and the electroconductive film 13 on the back surface is formed on a side face of the substrate 9 of the reticle R1, it is possible to omit the conduction mechanism 70A (conduction pin 72A) on the pattern surface side of the substrate 9 or the conduction mechanism 70B (conduction pin 72B) on the back surface side.

Furthermore, in FIG. 8A, the device may be configured, for example, in such a configuration that an opening is provided at a position opposite to the leaf spring 75 of the outer door 38 of the outer pod 39A and there is provided a mechanism capable of returning the leaf spring 75 to the bottom surface side from the outside of the outer door 38. By this configuration, the conduction pin 72A can be moved away from the reticle R1 as occasion may demand, in the state in which the inner pod 41A is kept in the outer pod 39A. Similarly, the device may be configured in such a configuration that a mechanism capable of retracting the biasing mechanism 78 to the outside is also provided on the outer dome 37 side and the conduction pin 72 is moved away from the reticle R1 as occasion may demand.

Next, a modification example of the present embodiment will be described with reference to FIGS. 9A and 9B. It is noted that portions in FIGS. 9A and 9B corresponding to those in FIGS. 8A and 8B will be denoted by the same reference signs and the detailed description thereof will be omitted.

Figure 9A:
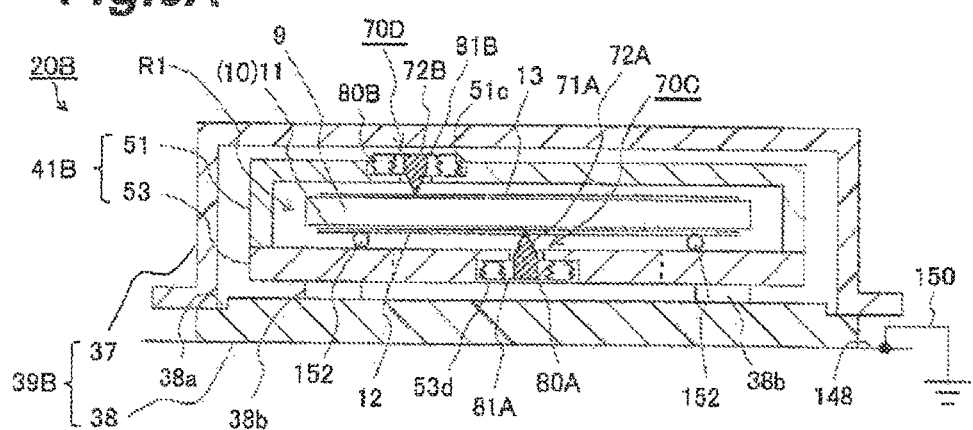
FIG. 9A is a cross-sectional view showing a reticle pod in a modification example and FIG. 9B a cross-sectional view showing the inner pod under a vacuum environment.
Figure 9B:
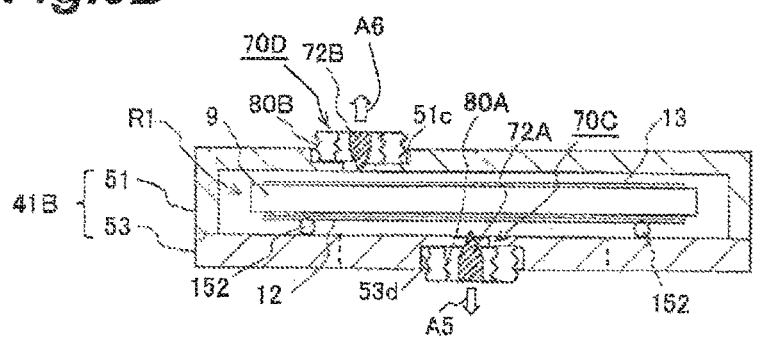

FIG. 9A is a cross-sectional view showing a reticle pod 20B in the modification example and FIG. 9B a cross-sectional view showing an inner pod 41B in the modification example. In FIG. 9A, the reticle pod 20B is a double pod composed of an inner pod 41B which keeps the reticle R1 therein, and an outer pod 39B which keeps the inner pod 41B therein. In this modification example, as an example, the outer dome 37 and the outer door 38 of the outer pod 39B are made each of an electroconductive resin and the cover member 51 and the base plate 53 are made each of metal.

Furthermore, in the peripheral region of the base plate 53 of the inner pod 41B, an opening 53d is provided at a position opposite to the second absorption film 12 on the pattern surface of the substrate 9 of the reticle R1, a thin metal bellows 80A having an annular cross section and being flexible in the thickness direction is fixed to the base plate 53 so as to surround the opening 53d, and a conduction pin 72A is fixed so as to be capable of coining into contact with the substrate 9 of the reticle R1 through the opening 53d, to a top surface of a metal support plate 81A fixed to a bottom surface of the bellows 80A. The bellows 80A, support plate 81A, and conduction pin 72A constitute an electric conduction mechanism 70C. The bellows 80A is kept airtight with air enclosed inside and the bellows 80A contracts under the atmospheric pressure, whereby the bellows 80A forces the conduction pin 72A to pass through (or break) the second absorption film 12 on the pattern surface of the substrate 9 to reach the first absorption film 11 (or further reach the multilayer film 10). For this reason, the pattern surface of the substrate 9 becomes electrically conductive through the conduction mechanism 70C to the base plate 53.

Furthermore, in the cover member 51 of the inner pod 41B, an opening 51c is provided at a position opposite to the electroconductive film 13 on the back surface of the substrate 9 of the reticle R1 in a region surrounded by the support members 152 at a plurality of locations. A bellows 80B being flexible in the thickness direction, which is similar to the bellows 80A, is fixed to the cover member 51 so as to surround the opening 51c and a conduction pin 72B is fixed so as to be capable of coining into contact with the substrate 9 of the reticle R1 through the opening 51c, to a bottom surface of a metal support plate 81B which is fixed to a top surface of the bellows 80B. The bellows 80B, support plate 81B, and conduction pin 72B constitute an electric conduction mechanism 70D. The bellows 80B is also kept airtight with air enclosed inside and the bellows 80B contracts under the atmospheric pressure; therefore, even if an oxide film is formed on the surface of the electroconductive film 13 on the back surface of the substrate 9, the bellows 80B will force the conduction pin 72B to pass through (or break) the oxide film to reach the electroconductive film 13. For this reason, the back surface of the substrate 9 becomes electrically conductive through the conduction mechanism 70D and the cover member 51 to the base plate 53.

In this modification example, when under the atmospheric pressure environment the inner pod 41B keeping the reticle R1 therein is kept in the outer pod 39B and the outer pod 39B is grounded through the ground line 150, the pattern surface and the back surface of the substrate 9 of the reticle R1 are stably grounded through the respective conduction mechanisms 70C, 70D, the base plate 53, and the outer door 38 including the seats 38b. Therefore, the electrostatic destruction of the pattern of the reticle R1 and the electrostatic adhesion of foreign matter are prevented.

Then, even in the state in which the outer pod 39B is carried to the outer pod opener 31 in FIG. 1 and the inner pod 41B taken out of the outer pod 39B is received by the grounded carry arm of the second atmospheric robot 29, the pattern surface and the back surface of the substrate 9 of the reticle R1 in the inner pod 41B are stably grounded through the carry arm. Furthermore, in the process of carrying the inner pod 41B into the load lock chamber 23 in FIG. 1 and vacuumizing the interior of the load lock chamber 23, the thickness of the bellows 80A becomes gradually larger, whereby the conduction pin 72A is retracted downward, as indicated by an arrow A5 in FIG. 9B. In parallel to it, the thickness of the bellows 80B also becomes gradually larger and the conduction pin 72B is retracted upward, as indicated by an arrow A6 in FIG. 9B. Therefore, the conduction pins 72A, 72B are moved away from the reticle R1 to make each of the pattern surface and the back surface of the substrate 9 of the reticle R1 electrically floating, but there is no new charging with static electricity, causing neither substantial electrostatic destruction of the pattern nor electrostatic adhesion of foreign matter.

Thereafter, the contact and separation of the conduction pins 72A, 72B with and from the reticle R1 are not carried out under the vacuum environment where the dispersal distance is large and, therefore, the adhesion of foreign matter or the like to the pattern area of the reticle R1 is also prevented. After that, use of the reticle R1 is finished in the exposure apparatus EX and, in the process of carrying the inner pod 41B with the reticle R1 kept therein, into the load lock chamber 23 by the vacuum robot 15 in FIG. 1 and returning the interior of the load lock chamber 23 to the atmospheric pressure, the bellows 80A becomes gradually contracting to force the conduction pin 72A to pass through the second absorption film 12 of the reticle R1 and to come into contact with the first absorption film 11 or the multilayer film 10. In parallel to it, the bellows 80B also becomes gradually contracting to force the conduction pin 72B to come into contact with the electroconductive film 13 of the reticle R1, as shown in FIG. 9A. Therefore, the pattern surface and the back surface of the substrate 9 of the reticle R1 are grounded through the conduction pins 72A, 72B, the base plate 53, and the grounded table (not shown). Furthermore, even if foreign matter is produced because of breakage of the first absorption film 11 or the like during the process of bringing the conduction pins 72A, 72B into contact with the reticle R1, influence thereof will be little because the dispersal distance of the foreign matter is shorter than under the vacuum environment.

In this modification example, it is also possible to use synthetic resin as well as metal, as a material of the bellows 80A, 80B.

Furthermore, in this modification example as well, when an electroconductive film for achieving electric conduction between the multilayer film 10 and the electroconductive film 13 is formed, for example, on a side face of the reticle R1, the conduction mechanism 70C (conduction pin 72A) or the conduction mechanism 70D (72B) can be omitted.

Figure 10:
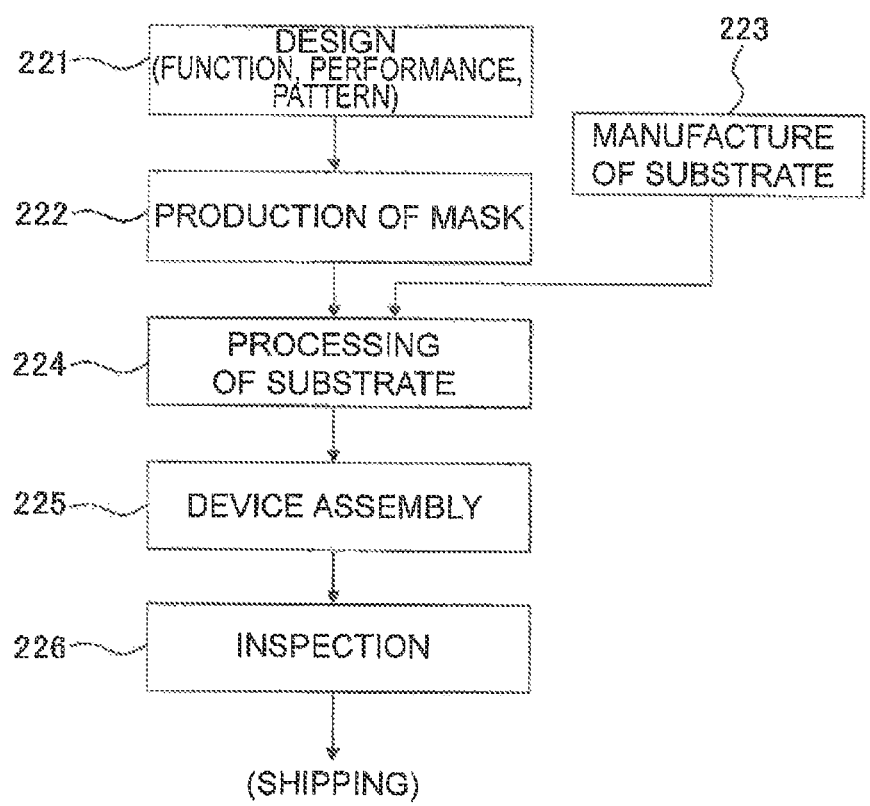
FIG. 10 is a flowchart showing an example of steps for manufacturing electronic devices.

In manufacturing electronic devices (or microdevices) such as semiconductor devices with the use of the exposure apparatus EX (or the exposure method) of the first or second embodiment, the electronic devices are manufactured, as shown in FIG. 10, through a step 221 to perform design of functionality and performance of the electronic devices, a step 222 to produce a mask (reticle) based on this design step, a step 223 to produce a substrate (wafer) as a base material of the devices and coat the substrate with a resist, a substrate processing step 224 including a step of exposing the substrate (sensitive substrate) with the pattern of the mask by the aforementioned exposure apparatus EX (or the exposure method) of the embodiment, a step of developing the exposed substrate, and heating (curing) and etching steps of the developed substrate, a device assembly step (including processing steps such as a dicing step, a bonding step, a packaging step, and so on) 225, an inspection step 226, and so on.

In other words, this device manufacturing method includes the step of forming the pattern on the substrate (wafer) with the use of the exposure apparatus (or the exposure method) in the above embodiment, and the step of processing the substrate on which the pattern has been formed (step 224). With the exposure apparatus of the above embodiment, the electronic devices can be manufactured with high accuracy because the electrostatic destruction of the pattern of the reticle R, R1 and the electrostatic adhesion of foreign matter can be effectively prevented.

Furthermore, the above embodiments use the EUV exposure apparatus as the exposure apparatus, but the reticle R and the reticle pod 20, 20A, 20B in the above embodiments may also be used in the exposure apparatus using ultraviolet light as the exposure light or in the electron beam exposure apparatus using an electron beam as the exposure light.

Furthermore, the exposure apparatus of the above embodiments can be manufactured by incorporating the illumination optical system and the projection optical system composed of a plurality of mirrors and others into the main body of the exposure apparatus, implementing optical adjustment thereof, attaching the reticle stage and the wafer stage composed of a large number of mechanical components to the main body of the exposure apparatus, implementing connection of wires and pipes, and further implementing overall adjustment (electrical adjustment, confirmation of operation, and others). It is noted that the manufacture of the exposure apparatus is preferably conducted in a clean room in which the temperature, cleanliness, etc. are controlled.

It should be noted that the present invention can be carried out in a variety of configurations without departing from the spirit and scope of the present invention, while not having to be limited only to the above embodiments.

The disclosure in the foregoing Publication, International Publication, U.S. Patent, or U.S. Pat. Application Publication cited in the present specification is incorporated herein by reference as part of the description of the present specification.

REFERENCE SIGNS LIST

EX exposure apparatus; R, R1 reticle; PO projection optical system; W wafer; RST reticle stage; 8A-8D ground regions; 9 substrate; 10 multilayer film; 11 first absorption film; 12 second absorption film; 13 electroconductive film; 20, 20A, 20B reticle pod; 39, 39A, 39B inner pod; 41, 41A, 41B outer pod; 72A, 72B conduction pins; 130A, 130B electric conduction members.

The invention claimed is:

1. A mask protection device capable of keeping a mask therein, the mask protection device comprising:
    a housing container configured to contain the mask therein;
    an electroconductive contact portion disposed inside the housing container and configured to contact with an electroconductive film of the mask when the mask is contained within the housing container; and
    an electric conduction member connected between the electroconductive contact portion and an outside of the housing container to achieve electric conduction between the mask and the outside of the housing container,
    wherein the housing container includes at least one of a recess in an inner surface thereof and an opening extending through the housing container, and the electric conduction member extends into the recess or the opening.

2. The mask protection device according to claim 1, wherein
    the electroconductive contact portion has an electroconductive resin portion.

3. The mask protection device according to claim 1, wherein
    the electroconductive contact portion includes:
        a first contact portion configured to come into contact with a first portion of the electroconductive film located on a pattern surface of the mask; and
        a second contact portion configured to come into contact with a second portion of the electroconductive film located on a back surface of the mask, the back surface facing in a direction opposite to a direction that the pattern surface faces.

4. The mask protection device according to claim 1, wherein
    the electric conduction member has a biasing portion configured to exert a biasing force to press the electroconductive contact portion against the electroconductive film.

5. The mask protection device according to claim 4, wherein the housing container is a first housing container, the mask protection device further comprising:
    a second housing container configured to contain the first housing container therein, wherein
    the electric conduction member includes an electroconductive connection member which connects the electroconductive contact portion to the first housing container, and
    the second housing container has a second electric conduction member which achieves electric conduction between the first housing container and at least a partial region of an outer surface of the second housing container.

6. The mask protection device according to claim 5, wherein
    the electroconductive connection member also serves as the biasing portion.

7. The mask protection device according to claim 5, wherein
    the biasing force is generated when the second housing container contains the first housing container therein.

8. The mask protection device according to claim 5, wherein the biasing portion is provided in the second housing container.

9. The mask protection device according to claim 5, wherein the electric conduction member further has a displacing device which moves the electroconductive contact portion to bring the electroconductive contact portion into contact with the electroconductive film when a pressure around the first housing container becomes higher than a predetermined value, and which moves the electroconductive contact portion away from the electroconductive film when the pressure around the first housing container becomes lower than the predetermined value.

10. The mask protection device according to claim 5, wherein the second housing container includes:
a first member on which the first housing container is mounted; and
a second member mounted on the first member to cover the first housing container mounted on the first member, and
the electric conduction member further has a displacing device which moves the electroconductive contact portion to bring the electroconductive contact portion into contact with the electroconductive film when the first housing container containing the mask therein is mounted on the first member, and which moves the electroconductive contact portion away from the electroconductive film when the first member and the second member are separated from each other.

11. The mask protection device according to claim 10, wherein the displacing device moves the electroconductive contact portion away from the electroconductive film by change of relative position between the first member and the second member.

12. The mask protection device according to claim 9, wherein the biasing portion exerts the biasing force between the electroconductive contact portion and the electroconductive film, using movement by the displacing device.

13. An exposure apparatus for illuminating a pattern with an exposure beam to expose an object with the exposure beam via the pattern and via a projection optical system, the exposure apparatus comprising:
a mask stage configured to hold a back surface of a mask taken out of the mask protection device as set forth in claim 1;
an electroconductive member configured to contact an electroconductive film provided on a pattern surface of the mask, the back surface facing in a direction opposite to a direction that the pattern surface faces; and
a ground member which grounds the electroconductive member.

14. The exposure apparatus according to claim 13, wherein the exposure beam is EUV light.

15. A method for manufacturing a device, comprising:
forming a pattern on an object with use of the exposure apparatus as set forth in claim 13; and
processing the object on which the pattern has been formed.

16. A carrying device for a mask, comprising:
a mounting portion on which the mask protection device as set forth in claim 1 is mounted; and
a ground member which grounds the mounting portion.

* * * * *